United States Patent [19]

Anderson et al.

[11] Patent Number: 4,678,073

[45] Date of Patent: Jul. 7, 1987

[54] APPARATUS AND METHODS FOR HANDLING BULK ARRAYS OF ARTICLES

[75] Inventors: Carl R. Anderson, Arvada; Gary G. Seaman, Broomfield, both of Colo.

[73] Assignee: American Telephone and Telegraph Company, AT&T Technologies, Inc., Murray Hill, N.J.

[21] Appl. No.: 719,934

[22] Filed: Apr. 4, 1985

[51] Int. Cl.⁴ .................. B65G 47/19; B65G 47/20
[52] U.S. Cl. ............................ 198/396; 198/394; 198/444; 198/577; 221/188
[58] Field of Search ............... 198/394, 396, 434, 444, 198/456, 460, 464.2, 468.2, 464.4, 463.6, 540, 572, 573, 577; 414/71, 282; 198/547, 578, 631, 453, 562; 221/186–188

[56] References Cited

U.S. PATENT DOCUMENTS

| | | | |
|---|---|---|---|
| 2,735,096 | 2/1956 | Miller | 221/188 X |
| 2,753,058 | 7/1956 | Potthoff et al. | 198/443 X |
| 3,202,303 | 8/1965 | Chasar | 414/282 |
| 3,638,564 | 2/1972 | Prange et al. | 198/434 X |
| 3,986,604 | 10/1976 | Siryj | |
| 4,165,809 | 8/1979 | Klein et al. | 198/444 X |
| 4,231,465 | 11/1980 | Bourgeois | 198/460 |
| 4,239,436 | 12/1980 | Wildenaur | |
| 4,353,454 | 10/1982 | Tolasch et al. | 198/577 X |

FOREIGN PATENT DOCUMENTS

| | | | |
|---|---|---|---|
| 1164395 | 3/1984 | Canada | 198/463.6 |
| 0052316 | 5/1981 | Japan | 198/444 |
| 0189923 | 11/1982 | Japan | 198/463.6 |

*Primary Examiner*—Robert J. Spar
*Assistant Examiner*—Lyle Kimms
*Attorney, Agent, or Firm*—R. F. Kip, Jr.; Harry L. Newman

[57] ABSTRACT

A hopper tray for receiving a bulk array for articles, all the same oblong shape and size, is disposed on one side of an elongated conveyer. The tray is angularly movable between an up position at which articles on the tray are discharged onto the conveyer and a down position. The articles are transported one at a time, to a zone at which they are stopped by their contact with a stop plate and their arrival is indicated by a signal fed from a photodetector to a controller. A failure of an article to timely arrive at the zone indicates a probable jamming upstream of articles, and the controller responds to cause a temporary reverse movement of the conveyer tending to relieve the jam. The article stopped by the plate is, if at an angle, reoriented to bear flush against the plate, either lengthwise or widthwise to the conveyer, by the force exerted on the articles by the continuing movement of the conveyer. A probe senses whether the articles have been oriented lengthwise or widthwise. If widthwise, the stop plate is moved by a piston to locate the length axis of the stopped article in the position occupied by the width axis of lengthwise articles when stopped. The stopped articles are adapted to be removed from the zone by a robot unit. To prevent interference with such removal the next article is temporarily clamped against a guide wall on one side of the conveyer.

3 Claims, 5 Drawing Figures

APPARATUS AND METHODS FOR HANDLING BULK ARRAYS OF ARTICLES

FIELD OF THE INVENTION

This invention relates generally to apparatus and methods for handling bulk arrays of articles, and which involve transport of such articles by a conveyor. More particularly, this invention relates to apparatus and methods of such sort for dealing with jamming of articles on the conveyor and/or orienting initially disoriented articles thereon in standardized positions. While the invention will be described in terms of apparatus and methods for handling bulk arrays of articles which are electrical components destined to be mounted on printed wiring boards, the invention is applicable as well to the handling of other kinds of articles.

BACKGROUND OF THE INVENTION

In the manufacture of circuit assemblies for various electrical equipments as, for example, telephone sets, it if often necessary to mount integrated circuits and other electrical components on printed wiring boards by inserting the leads of the components into holes in the boards for later soldering or otherwise fastening of the components in place. Such insertion operation is now done on an assembly line by robots which pick up the components, properly position them over the boards, and then lower them so that the leads of each component are inserted into the corresponding holes in the board. In order, however, for a robot to so pick up and then properly position a component, the component before being picked up should be in some standardized position in relation to the robot jaws which will grasp it.

The electrical components being discussed are usually furnished to the plant in bulk in cartons containing them in a single layer in a rectangular grid array, with all components being right side up or upside down in the carton. In order for such components to be made ready for robot pick-up, they must be removed from the carton, transferred to a specified location and be rendered at that location in standardized position. That manipulating of the components can, of course, be performed by hand. Such manual performance of the steps described is, however, expensive in terms of labor costs and not wholly reliable. Hence, there is need for a capability of performing one or more of such handling steps in an automatic manner.

SUMMARY OF THE INVENTION

Such need is satisfied according to the invention by providing apparatus for handling a bulk array of articles comprising: hopper means for receiving said array of articles from, say, a carton, and having a discharge opening for the received articles, an elongated conveyor registering with said opening to receive articles discharged therefrom and extending to a zone beyond said opening, motor means to drive such conveyor forward for transport thereby to said zone of articles discharged onto said conveyor from said opening, and means for affecting the relative or individual positions of ones of such articles in the course of their progress through such apparatus to such zone.

According to the invention in one of its aspects, such hopper means comprises a tray having at its front a discharge opening the bottom of which is defined by an edge of the tray, the elongated conveyor is disposed outward of, and tangential on its inner side with, such edge and, moreover extends alongside said opening and beyond it to said zone, and the apparatus includes (a) an abutment disposed opposite such edge at the outer side of the conveyor for retaining articles thereon, and (b) tray tilting means for displacing the tray's rear up and down relative to its front so as to move the tray between down and up angular positions at which articles on the tray will, respectively, remain on it and slide off it onto the conveyor. The tilting of the tray down from an up position is adapted to relieve pressure on articles forced on the conveyor against the abutment by articles still on the tray so as, thereby, to tend to avoid a stalling of articles on the conveyor in their transport to the mentioned zone.

As another aspect of the invention separate from that described in the immediately preceding paragraph, the mentioned position-affecting means comprises means for determining when a jamming of articles together on the conveyor occurs, and control means which then becomes operable to impart to said conveyor a temporary reverse movement tending to relieve such jamming.

As still another aspect of the invention separate from those described in the two immediately preceding paragraphs, the mentioned position-affecting means comprises positioning means disposed at the mentioned zone for there stopping articles transported thereto by the conveyor and for, moreover, orienting the stopped articles so as to place them in positions which are standardized for, for example but without restriction, pickup by a robot unit.

Other aspects of the invention will become evident upon a reading of the remainder of this specification and of the claims appended thereto.

BRIEF DESCRIPTION OF THE DRAWING

For a better understanding of the invention, reference is made to the following description of a representative embodiment thereof, and to the accompanying drawings wherein.

DETAILED DESCRIPTION OF EMBODIMENT

Figure 1:
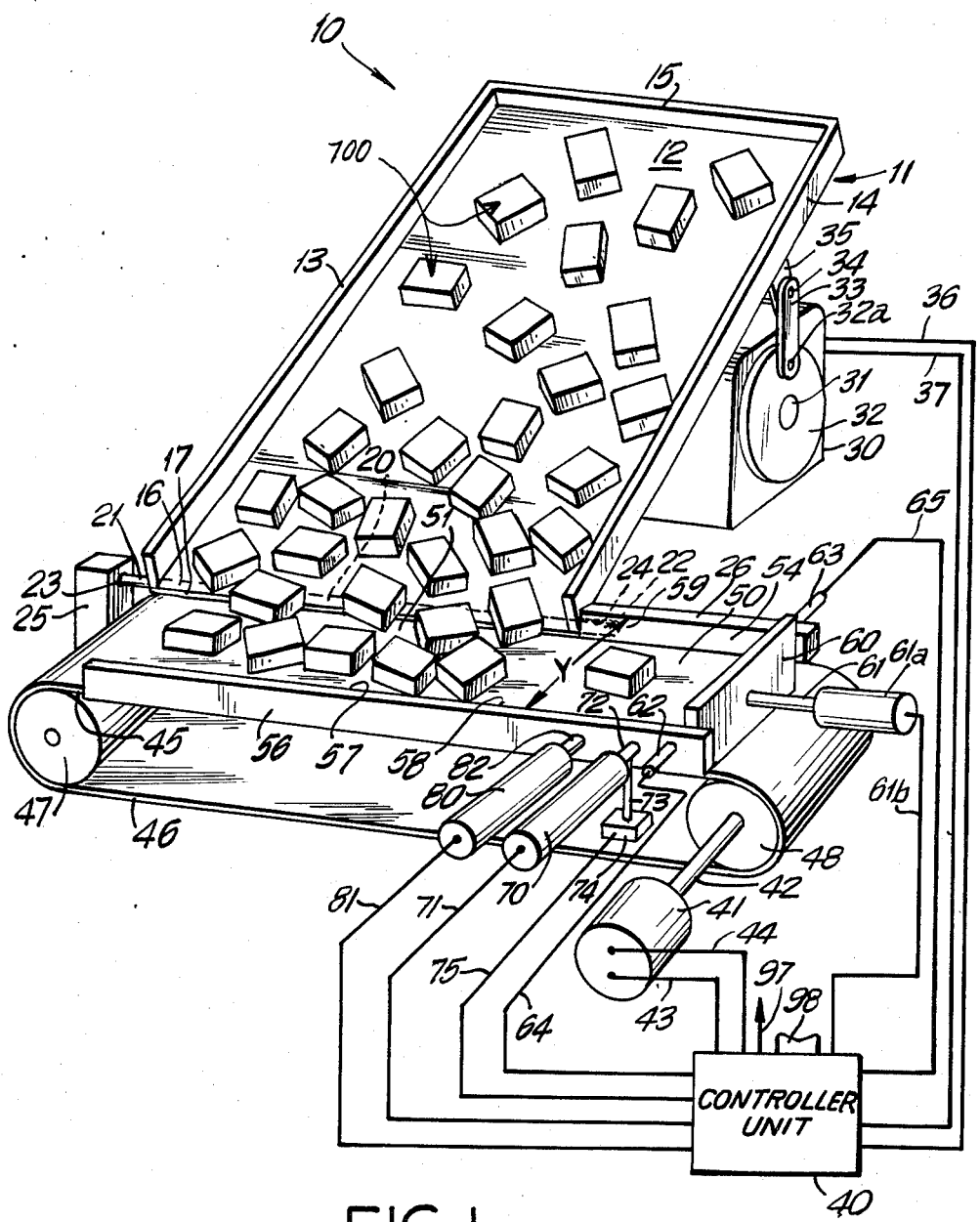
FIG. 1 is an isometric view of exemplary apparatus according to the invention.

Referring now to FIG. 1, the reference numeral 10 generally designates an apparatus for handling a bulk array of articles as, for example but without restriction, electrical components destined to be mounted on printed wiring boards. Apparatus 10 comprises hopper means in the form of a hopper tray 11 comprising a planar hopper plate 12 bordered on its longitudinally opposite sides by raised retaining walls 13, 14 and, at its rear, by a similar raised retaining wall 15. At its front, tray 11 has a discharge opening 16 extending between the front ends of walls 13, 14, and the bottom of which opening is defined by an edge 17 of tray 11. Edge 17 is linear and longitudinally aligned and constitutes the front edge of planar tray plate 12.

Fastened beneath edge 17 to plate 12 in parallel relation with that edge is a long pivot shaft 20 projecting outward from both of the longitudinally opposite sides of tray 11, and having its left and right hand ends 21 and 22 journaled in bearing sockets 23 and 24 formed in respectively, (a) a fixed bearing block 25 to the left of tray 11 and (b) the left hand end wall of a guide member 26 to the right of the tray. Shaft 20 thus pivotally mounts tray 11 for angular movement about the axis of that shaft. Preferably, such axis is, insofar as possible, coincident with edge 17 so that, for practical purposes, such angular movement can be considered to take place essentially around the line defined by that edge.

Such angular movment is adapted to be imparted to tray 11 by means comprising an electric motor 30 having a shaft 31 on the free end of which is affixed a circular disc 32 coupled, near its periphery, by a pin 32a projecting therefrom, to the lower end of crank arm 33 of which the upper end is coupled by a pin 34 to a post 35 fixed to and downstanding from the underside of plate 12 at the rear of that plate. Motor 30 is adapted to be energized via leads 36, 37 by a controller unit 40. Unit 40 may conveniently be a Fluke Model No. 2400A controller made by the Fluke manufacturing company of Everett, Washington. When energized, the motor 30 is adapted through motion linkage 31-35 to displace the rear of tray 11 up and down relative to its front so as to move that tray between down and up angular positions. Elements 20-26 and 30-35 thus provide a tray tilting means for tray 11.

Disposed laterally outward of the edge 17 of tray is an elongated conveyer 45 provided by the top part of an endless stainless steel belt 46 wrapped at its left and right hand ends around, respectively, an idler drum 47 and a driving drum 48. Conveyer 45 is adapted to be moved by motor means comprising drum 48 and a reversible electrical motor 41 mechanically coupled by shaft 42 to that drum and energizable via leads 43, 44 by controller unit 40.

As shown, conveyer 45 from its left hand end extends longitudinally to the discharge opening 16 of tray 10 and then alongside such opening and then beyond it to and through a positioning zone 50 spaced from opening 16 and terminating at its right end at about the same longitudinal location as the axis of drum 48. In passing alongside discharge opening 16, the top or carrying surface 51 of conveyer 45 is, on its inner side, tangential with the edge 17 of tray 11 in the sense that such inner side is parallel to edge 17 and, that throughout the angular movements of that tray, surface 51 remains substantially at the same level as that edge, and the inner side of surface 51 is separated from edge 17 by a discontinuity or gap 106 (FIGS. 2A and 2B) which is small enough to have no significant effect on the operation (later described) of the hopper tray and the conveyer.

Conveyer 45 is bordered on its laterally outer side by an elongated guide member 45 extending longitudinally from the left hand end of tray 11 to the right hand end of zone 50. Opposite edge 17 of the tray 11, guide member 46 provides an abutment 57 which is raised above conveyer surface 51 and which is adapted to retain on that surface any articles discharged thereon from tray 11. Between the tray's discharge opening 16 and positioning zone 50, guide members 26 and 56 provide respective guide walls 58 and 59 raised above the level of conveyer 45 and defining therebetween a channel for passage of articles on the conveyer from discharge opening 16 to positioning zone 50. At and on the inner side of that zone, guide member 26 provides a fixed wall 54 used as later described. The right hand end of zone 50 is closed by a stop plate 60 disposed proximately above the conveyer surface 51 and carried by a piston rod 61 extending from a solenoid actuated air cylinder 61a controlled via a lead 61b by controller unit 40. Under the control of that unit, rod 61 may be longitudinally displaced back and forth to correspondingly displace plate 60 relative to conveyer 45.

Disposed slightly to the left or rear of the right hand end of zone 50 is an article sensing means comprising: a radiati source 62, the front of which is inserted in a hole 62a (FIG. 3) extending laterally through guide member 56, and (b) a radiation detector 63 the front of which is inserted in a hole 63a (FIG. 3) extending laterally through guide member 26 opposite the hole in member 56 so that detector 63 receives from source 62 a beam 66 of radiation interruptible by blockage by it of an article on conveyer 45 and in zone 50. Source 62 may conveniently be a conventional visible or infra-red light source, and detector 63 may correspondingly be a conventional visible or infra-red semiconductive photodetector. Source 62 is energized via lead 64 from controller unit 40, and the output of detector 63 is supplied via lead 65 to that controller unit.

Disposed next to and leftward of source 62 is a solenoid actuated air cylinder 70 controlled via lead 71 by controller unit 40. Cylinder 70 has a piston rod 72 extending through a lateral hole 72a (FIG. 3) in member 56 to be movable by cylinder 70 between positions at which the front end of the rod is respectively, (a) flush with or slightly retracted inward from the inner wall of that member and (b) advanced forward from that wall to extend part way into zone 50. Rod 72 carries in fixed relation therewith an actuating lever 73 for a microswitch 74 coupled via lead 75 to controller unit 40.

Leftward of cylinder 70 is another solenoid actuated air cylinder 80 controlled via a lead 81 from controller unit 40 and having a piston rod 82 extending through another lateral hole 82a (FIG. 3) in guide member 56 to be movable by cylinder 80 between positions at which the front end of rod 82 is, respectively, (a) flush with or slightly retracted inward from the inner wall of guide member 56, and (b) advanced forward from that inner wall to extend part way into zone 50.

Figure 3:
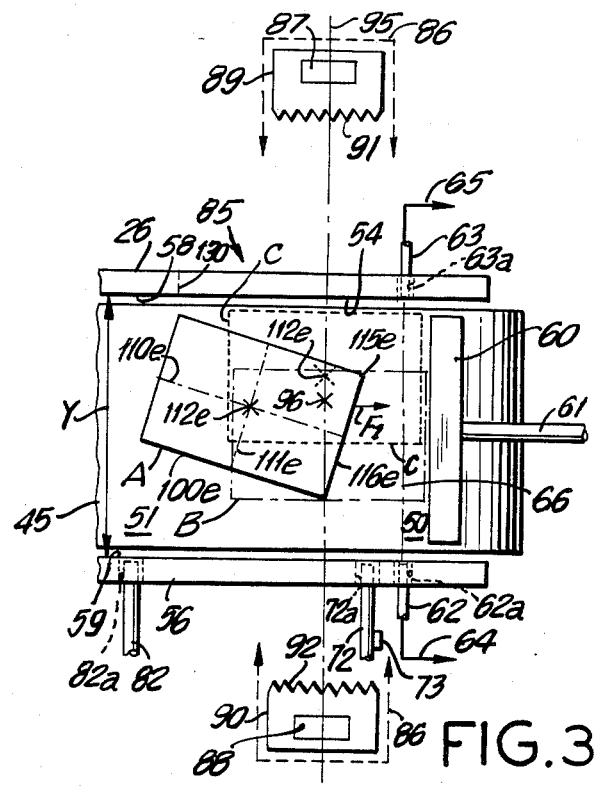
FIG. 3 is a schematic plan view of the right hand end of the FIG. 1 apparatus and of parts of a robot unit associated therewith, such view being illustrative of the mode of orientation to a standardized position of a component initially disoriented to lie primarily lengthwise on the conveyor.

Associated with but separate from apparatus 10 is a program-controlled robot unit 85 depicted shcematically in FIG. 3. Unit 85 may conveniently be a SSRH series robot made by the Suwa Seikosha company and available from its U.S. Sales Office, Suite 4811, World Trade Center, N.Y., New York 10048. The robot unit comprises an upper main body 86 (represented by dash line) poised over conveyer 45 at zone 50 and including (in a housed manner) the various components necessary for the robot to perform mechanical operations under signal control. Extending downward from body 86 are a pair of movable arms 87, 88 to the respective lower ends of which are affixed a pair of jaws 89, 90 having toothed jaw faces 91, 92. Jaws 89, 90 are vertically disposed to be high enough to clear the tops of guide members 26, 56 but low enough to grasp the sides of articles transported by conveyer 45 into zone 50. In the lateral dimension, jaws 89 and 90 are spaced from each other so that jaw faces 91, 92 are each normal to and bisected by a common jaw centerline identified by reference numeral 95. Centerline 95 is normal to the line of longitudinal movement of conveyer 45, and it defines the line of lateral movement of jaws 89 and 90 towards and away from each other.

Line 95 is a reference line fixed in relation to the FIG. 1 apparatus in the sense that line 95 is a horizontal line lying at some position in a vertical plane fixed in relation to that apparatus. Centerline 95 is intersected at a right angle by a vertical reference axis 96 for the robot unit 85. Unit 85 is one wherein, when jaws 89 and 90 are commanded to close towards each other to the end of grasping an object, they will continue that closing movement until opposite sides of the object are contacted by both jaws so that the object is gripped between them. Moreover, robot unit 85 provides in a well known manner a grasping of the object which is self centered in the sense that the respective lateral movements of the jaws are controlled to cause the two jaw faces at the end of their movements, and when gripping opposite sides of the object, to be equidistantly spaced, in opposite directions along line 95, from the vertical reference axis 96 for the robot unit.

Signals can be exchanged between the controller unit 40 (FIG. 1) and the robot unit 85 (FIG. 3) by a lead 97 (FIG. 1).

Associated with controller unit 40 is an ON-OFF switch 98 for initiating and terminating operations of the apparatus 10.

USE AND OPERATION

The described apparatus is used and operated in a manner as follows. As a first step with both of motors 30 and 41 being "off", motor 30 is indexed as necessary to place and stop hopper tray 11 at a "down" angular position which is near horizontal. The tray is then loaded with a bulk array of electrical components 100. As earlier described, such array of components is usually furnished to the plant in a carton within which the components are arranged in a single layer in a rectangular grid array, with the leads of all the components being on one side or the other of the array. Loading of the components from the carton onto the tray may be accomplished by placing the carton on a support surface so that its side away from the component leads is face up, opening the carton by removing that side, placing a stiff "cookie" sheet over the carton opening thus formed, turning the carton upside down while the sheet is held against it to dump the components onto the sheet, and then sliding the components off the sheet onto the plate 12 of the tray 11. When the components are so slid onto the hopper tray, their orientation becomes completely arbitrary with the exception that all components face up so that their leads (not shown) project upwards from the tops of the components.

As depicted in FIG. 1, all of the components 100 in the array on tray 10 are in the form of rectangular parallelepipeds which are all of the same size and shape. Moreover the components are oblong in that all components are longer than they are wide. In the particular array of components being considered, the width of each component is greater than one-half its length.

With the components 100 being loaded onto tray 11, switch 98 is thrown to "on" to place controller unit 40 in operating condition. Under the control of unit 40, (a) motor 41 is energized to drive conveyer 45 forward to move its upper surface 51 alongside and past tray discharge opening 16 and then to and through positioning zone 50. Concurrently, motor 30 is energized to drive motion linkage 31-35 to cause through that linkage the rear of tray to be moved up and down in a manner which is conveniently periodic although apparatus 10 is also usable when that movement is aperiodic. Because tray 11 is pivotally mounted at its front as earlier described, such up and down movement of the tray's rear relative to its front is translated into an angular movement of the tray between an extreme "down" angular position at which components 100 remain on the tray and an extreme "up" angular position at which the components slide off the tray through discharge opening 16 and over edge 17 onto conveyer 45 to be distributed in an arbitrarily oriented manner along it. It will be evident that those "down" and "up" angular positions of tray 11 are on opposite sides of the "angle of slip" for the components 100 on tray plate 12. Such "angle of slip" is determined by the coefficient of friction between the components and that plate (i.e., is the angle the tangent of which is equal to that coefficient), and such "angle of slip" is the threshold angle of plate 12 relative to the horizontal at which the components 100 will first start to slide off the plate.

When the components 100 slide off the tray onto conveyer 45 to be retained thereon by the abutment 57, some of the components will be transported by the conveyer towards zone 50. As however, the tilt of tray 11 becomes progressively greater than the angle of slip, components still on the tray will push against components still on the conveyer and force them against the abutment. When a large number of components are still on the hopper tray, the forces pressing the components on the conveyer against the abutment can produce a jamming of components together sufficient, if unrelieved, to prevent any further transport of components by the conveyor to zone 50. Such jamming condition is depicted schematically in FIG. 2A wherein the tilt angle of tray 11 is substantially greater than the angle of slip. In those circumstances, the component 100a on conveyer 45 is pressed against abutment 57 by a great enough force from the components 100b, 100c, 100d still on the tray to hold component 100a stationary against the tendency of conveyer 45 to move the components along with the conveyer.

Figure 2A:
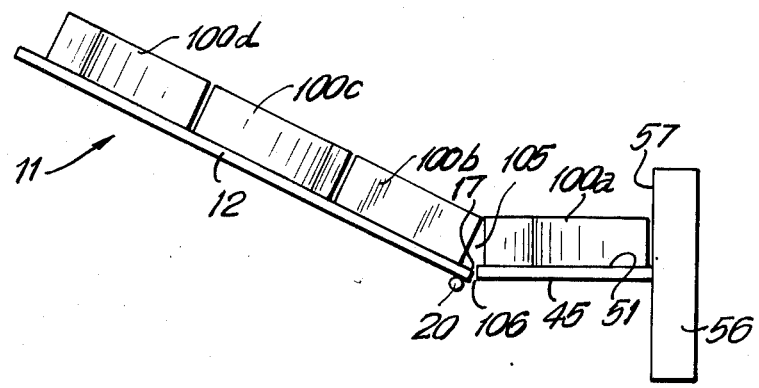
FIGS. 2A and 2B are schematic left side elevational views of parts of a hopper tray and conveyer belonging to the FIG. 1 apparatus, such views being illustrative of the jam-relieving effect afforded by the operation of such tray and conveyer.
Figure 2B:
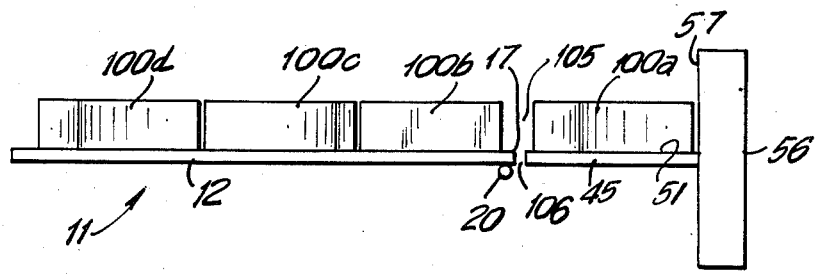

It is to be noted from the showing of FIG. 2A, that, because the components 100 are parallelepiped in shape and, thus, have sides at right angles to their bottoms, the force communicated from components 100b, 100c, 100d to 100a is through a contact made between the top front edge of component 100b and the top rear edge of component 100a. From that contact, the confronting sides of contacts 100a and 100b diverge downward from each other to be separated by a triangular gap 105 closed at the top and widest at its bottom where the gap straddles the discontinuity 106 between the front edge 17 of tray 11 and the inner edge of conveyer 45. The presence of that gap provides the felicitous result that, when tray 11 is moved from its "up" position of FIG. 2A to the "down" position below the angle of slip which is shown in FIG. 2B, gap 105 opens at its top so that components 100a, 100b are separated both at their tops and bottoms to thereby remove from component 100a the pressure which forces it against abutment 57. Such removal of force from component 100a frees it to be carried by conveyer 45 towards zone 50.

In this way, the alternate raising and lowering of tray 11 effects discharge of all the components thereon onto the conveyer 45 while concurrently relieving the jamming together of components and the blockage of transport of the components which both might well occur if tray 11 were to be continuously maintained raised above the angle of slip. Of course, a substantial number of raising and lowering cycles may be required to fully avoid the stalling of the components on the conveyer by being forced against abutment 57 by components still on the tray. With however, a sufficient number of such alternate raising and lowerings to completely empty the ray of components, no such stalling from such cause occurs at any time.

In connection with the foregoing, it is to be noted that, while in FIG. 2B, tray 11 is shown in a "down" position at which it is horizontal, the relieving, as described, of jamming caused by forcing of components against abutment 57 is realized for any "down" position of the tray below the angle of slip. It should be further noted that, while the described mode of relieving such jamming is effective for articles in the form of parallelepipeds, it is also effective for articles of other shapes.

As the components are moved by conveyer 45 towards zone 50, means are utilized in apparatus 10 to restrict the transport of components to such zone to one at a time of the components. In the situation being considered where the width of the components is greater than one half their length, such restricting means is provided by the simple expedient of making the dimension "Y" (FIG. 1) between guide walls 58 and 59 greater than the length dimension of the components but less than twice their width, the crosswise dimension of conveyer 45 being slightly smaller than "Y" to permit the conveyer to pass with clearance between the walls 58, 59. In cases, however, where the width of the components is equal to or less than half their length, the restricting means takes other forms as for example a blocking element (not shown) disposed above the conveyer in the passage or channel for transport thereby of components from the tray's discharge opening 16 to zone 50, the blocking element being adatped to restrict the width of that passage or channel so that only one component at a time can get past that element.

As the components 100 slide off the tray on the conveyer to be transported towards zone 50, the combined effect of the lateral sliding movement of the components and their longitudinal movement in being transported tends to produce a funneling of the components towards the entrance of the channel defined by guide walls 58, 59. That funneling in turn tends to produce a clustering of components in front of such entrance and, not infrequently, a jamming together of the clustered components and resultant stoppages in their transport, which is not overcome by the previously described alternate raising and lowering of tray 11. Stoppages caused by such jammings are, however, relieved in apparatus 10 in the following manner.

As mentioned, the components are restricted to move to zone 50 only one at a time. As each component moves through that zone, the component interrupts the light beam 66 (FIG. 3) between radiation source 62 and radiation detector 63 to produce a signal supplied by lead 65 to controller unit 40. Each such signal is adapted to set or reset in unit 40 a first timing circuit adapted, if not reset after a fixed time delay, to produce a stoppage indication and to then remain passive until next set. As a number of components move seriatim into and through zone 50, the passage of the first of them through beam 66 produces a first such signal which sets such circuit, and each of the subsequent components, provided they follow each other close on, resets such circuit before the expiration of the time delay so that no stoppage indication is produced. If however, due to a jamming up of components at the mentioned entrance and a resultant stoppage in the transport of components to zone 50, a signal from detector 63 is not followed by another signal therefrom before the expiration of the time delay, the first circuit produces the mentioned stoppage indication. A second timing circuit in unit 40 responds to each such indication to cause unit 40 to reversely energize motor 41 for a short time period and, at the end of that period, to again forwardly energize motor 41 and, moreover, to again set the first timing circuit.

When motor 41 is so reversely energized, it imparts (through shaft 42 and drum 48) to conveyer 45 a temporary reverse movement which tends to spread apart the components on the conveyer and, thereby, relieve the mentioned jamming. Hence, when, at the end of the mentioned period, motor 41 is forwardly energized to again produce forward conveyer movement, and the first timing circuit is again set, often the jam is broken so that, from then on, components are transported uninterrupted to zone 50 and the first timing circuit is inhibited by frequent passage of components through beam 66 from producing another stoppage indication. If, however, that jam is not broken so that the stoppage in the transport of components is continued, then the failure of a component to pass through beam 66 before the expiration of the time delay provided by the first circuit after it has been again set is an event which causes that circuit to again produce a stoppage indication leading to another temporary reverse movement of the conveyer.

In this way, a first stoppage in the transport of the components by the conveyer due to their clustering and jamming together at the entrance to their flow channel defined between guide walls 58 and 59 is alleviated by as many temporary reverse movements of conveyer 45 as are necessary to dissipate such jamming and thereby terminate such stoppage. Any subsequent stoppages from such cause are alleviated in the same manner.

As mentioned, when the components 100 are discharged from tray 11 onto conveyer 45, they are oriented on the conveyer in a wholly arbitrary manner. They can, however, be classified into two categories, namely components which are oriented primarily lengthwise on the conveyer and components oriented primarily widthwise thereon. Upon arrival of the components at zone 50, those in one and the other of such categories are, in part, handled differently as will now be described.

FIG. 3 depicts the transportation into zone 50 and the subsequent movements therein of a component 100$e$ disposed on conveyer 45 and initially oriented primarily lengthwise of the conveyer. Component 100$e$ has a length axis 110$e$ and a width axis 111$e$ intersecting axis 110$e$ at a reference point 112$e$ representing the center of the component. The original position A of component 110$e$ on the conveyer is shown in FIG. 3 in a solid line representation of the outline of the component. That component in its original position is said to be oriented primarily lengthwise because its length axis makes an angle with the line of movement of the conveyer in the range between and including zero degrees and 45 degrees.

As component 100e in position A is transported to the right-hand end of zone 50, it first passes through light beam 66 and then, almost immediately thereafter, fetches up against the then stationary stop plate 60 so that the upper right-hand corner 115e of the component bears against that plate to result in the stopping of further forward translational movement of the component. Upon such stopping, the continued forward movement of conveyer 45 beneath component 100e transmits thereto through the frictional coupling therebetween a forward force $F_1$ exerted at a distance from stopped corner 115e (and the receive stopping force exerted thereon by plate 60) so as to apply to component 100e a moment of fore. Under the urging of that moment, component 100e undergoes on conveyer 45 and about its stopped corner 115e a counterclockwise rotary movement which brings the component's whole front side 116e into contact with plate 60 so that the component is now in the position B shown in FIG. 3 by the dot-dash representation of the component's outline.

Component 100e is now in what is referred to herein as "standard position", and it is to be noted that, in that position, the center 112e of the component registers with reference line 95, with the component being disposed in a bilaterally symmetrical manner relative thereto.

Going back now to the passage of component 100e through beam 66, that passage generates a signal which indicates the presence of the component in zone 50, and which is fed from photodetector 63 to controller unit 40. Unit 40 utilizes that signal to activate, (after a time delay long enough for the component to assume position B) the air cylinder 70 (FIG. 1) so as to drive rod 72 (FIG. 3) forward to displace component 100e towards fixed wall 54 to ultimately be stopped by that wall. As a result of so being displaced by rod 72 and then stopped, component 100e is rendered in the position C shown in FIG. 3 by the dash outline of the component. When in that position, component 100e is also in the mentioned "standard position". In the course of pressing component 100e against wall 54, rod 72 travels towards that wall until the rod's front end is separated from wall 54 by the width dimension of the component. That travel of rod 72 is enough for the actuating lever 73 carried by the rod to actuate microswitch 74 (FIG. 1) to produce an indication fed to unit 40 that the component which has just passed through beam 66 is oriented lengthwise on the conveyer and is ready to be picked up. Responsive to that indication, unit 40 supplies via lead 97 (FIG. 1) to robot unit 85 (FIG. 3) a signal to commence operations.

The robot unit thereupon closes its jaw 89.90 along line 95 so as to grip the component 100e, now in position C, between those jaws. In the course of such gripping, jaw 89 contacts the component before jaw 90 but, because of the earlier described self-centering action of these jaws, at the end of the gripping operation, component 100e is held with its center 112e on the robot's axis 96 and with the component's width axis 111e coincident with the common center line 95 of the two robot jaws. The gripped component is thus disposed in a bilaterally symmetrical manner with respect to that center line.

That bilaterally symmetrical gripping of the component by the robot is made possible by the fact that before the gripping action took place, component 100e was rendered in a standardized position (in the manner described) in relation to jaw centerline 95 in the general sense that a known point on the component bears a known position relation to the such centerline, and in the more particular sense that such known point is the center 112e of the component and, further, such center registers with line 95, It is preferable also, as part of such pregripping standardized positioning of component 100e, that its width axis 111e be rendered coincident with jaw centerline 95 since, then, the gripping of the component by the jaws need not be accompanied by any angular twisting of the component by the jaws in the course of their gripping it.

With the components 100 which reach zone 50 being gripped bilaterally symmetrically between the jaws of robot unit 85 (as just described for component 100e), each such component is readied for further manipulation at one or more stations remote from that of unit 85 by one or more additional robot units at such one or more stations so as, in the end, the component is properly positioned for lowering by a last robot onto its designated location on a printed wiring board moving in an assembly line below and past that robot. Such further manipulating operations may be for various purposes. For example a typical component 100e may have a different lead configuration on one end than on its other, and it is inevitable that the first ends of some and others of the components picked up by unit 85 will be on the left side and the right side, respectively, of the jaws 89, 90 (FIG. 3). That lack of uniformity can, however, be corrected to have all such first ends be say, left-handed ends by (a) having robot unit 85 place each component on a fixture at a first remote station where the component is tested for left or right handedness, and (b) picking up the component from that first station by another robot unit which (1) responds to such testing to rotate only right-hand components through 180 degrees to convert them into left-handed components, and then (2) deposits all the components on a fixture at a further remote station. If, however, the components 100e after reaching zone 50 of apparatus 10 had not been rendered in that zone in standardized position so as to be capable of being gripped bilaterally symmetrically by robot unit 85, then that robot unit would now, in the first instance, be capable of transferring the components to a remote station so as to deposit them with the needed accurate positioning at that station.

Stop plate 60 remains stationary in the position shown in FIG. 3 all during the actions described in connection thereunder. This is not true, however, for the FIG. 4 actions which will now be described.

Figure 4:
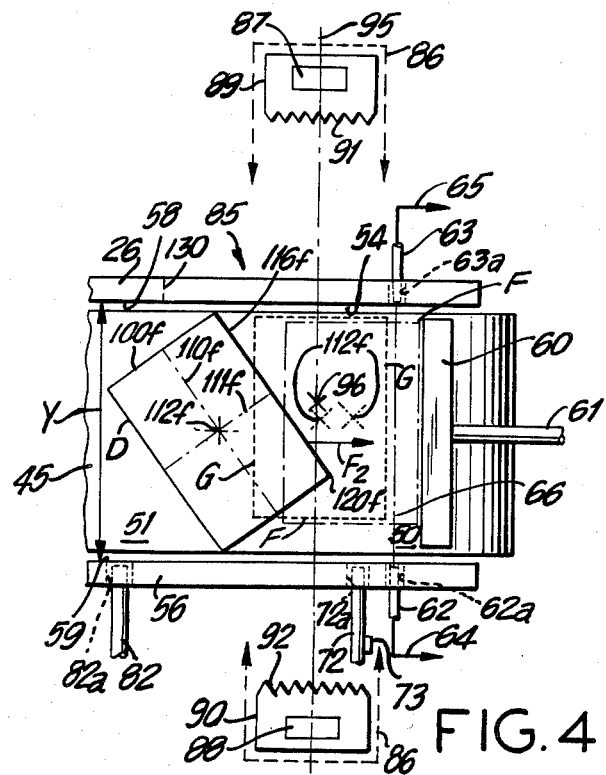
FIG. 4 is a schematic plan view similar to FIG. 3 except that FIG. 4 shows the mode of orientation to standardized position of a component initially disoriented to lie primarily widthwise on the conveyor.

FIG. 4 depicts the transportation into zone 50 and the subsequent movements therein of a component 100f initially oriented on conveyer 45 in a position D represented by the solid outline of the component. Position D is referred to herein as a primarily widthwise position because the angle between the width axis 111f of the component and the line of conveyer movement is in the range extending from zero degrees to 45 degrees. Component 100f is carried by the conveyer towards the right hand of zone 50 until the translational movement of the component is stopped by the coming into contact of the component's lower right hand corner 120f with the front face of stop plate 60. Then, similar to what has been described in connection with FIG. 3, the continuing movement of conveyer 45 exerts on component 100f a force $F_2$ creating about stopped corner 120 a moment of force causing clockwise rotation of the component on the surface 51 of the conveyer until the component assumes the position F represented in FIG. 4 by the dash-dot outline of the component. At position F, the front side 116f of component 100f is flush against the front face of then stationary stop plate 60.

Such position F is referred to herein as a "90 degree position" for a component 100 because it is at ninety degrees to the earlier described "standard position" for the components 100. In connection with the reaching of such 90 degree position by a component which is initially primarilty widthwise on the conveyer, it may be that the dimension Y between the walls 58 and 59 is less than the diagonal dimension of the component so that, if the "Y" dimension were to exist between walls 54 and 59, it would interfere with the rotation of the component into 90 degree position. To deal with such problem, at, say, the location 130 which is shown in FIGS. 3 and 4 and which marks the boundary between walls 58 and 54, the fixed wall 54 may be set back from guide wall 58 to widen zone 50 enough to permit such rotation to take place.

After component 100f has assumed the 90 degree position F, apparatus 10 operates similarly to the way before described in connection with FIG. 3 to cause the component 100f to be pushed by rod 72 against fixed wall 54. As one difference, however, from what is depicted by FIG. 3, the component's center 112f is displaced rightward of jaw center line 95 instead of being on that line. As a second difference, the front end of rod 72 is stopped in its travel towards wall 54 at a point where the front end of the rod is separated from such wall by the length dimension of component 100f. That smaller amount of travel of the rod than in the FIG. 3 case is not enough for the actuating lever 73 carried by the rod to actuate microswitch 74 to produce the indication described in connection with FIG. 3.

The failure of the microswitch to produce that indication soon after passage of the component through beam 66 and consequent production of a signal from detector 63 is, in itself, an indication to controller unit 40 that the component 100 pressed against wall 54 is in 90 degree position rather than the standard position C shown in FIG. 3. Unit 40 responds to that 90 degree indication to actuate air cylinder 61a (FIG. 1) to extend rod 61 so as to displace stop plate rearward (in relation to the forward movement of conveyer 45) until the stop plate pushes component 100f to the position G which is shown by the dotted outline of the component, and at which the center 112f of the component registers with the jaw centerline 94. The component is then held in that position by plate 60 until the component is picked up by robot unit 85. Thereafter, air cylinder 61a is actuated by unit 40 to restore the stop plate to its original position shown in FIG. 4, and zone 50 is thereby made ready to receive another component.

When component 100f is picked up by the jaws 89, 90 of the robot unit 85, the center 112f of the component is on the vertical reference axis 96 of the robot unit, and the length and width axes 110f and 111f of the component are, respectively, coincident with, and normal to the common centerline 95 of these jaws. That is, component 100f is gripped by these jaws to be bilaterally symmetrical about that centerline. In the FIG. 4 case as contrasted with the FIG. 3 case, the gripped component has an orientation which is widthwise rather than lengthwise to the conveyer 45 taken as a reference datum. The gripped component of FIG. 4 may, however, be readily changed to have an orientation lengthwise of that datum by using robot unit 85 to transfer the component to a station at which another robot unit picks up the component and then rotates it through 90 degrees.

Having described specifically the actions to which FIGS. 3 and 4 relate, some general comments on these actions are as follows.

In order for an array of components all with the same length and width to be positioned by these actions so that, ultimately, the centers of all such components lie on reference line 95, stop plate 60 must be set in its initial position shown in FIGS. 3 and 4 so that the plate's front face is spaced from line 95 by one-half of such length dimension, and also, the rearward stroke imparted to plate 60 by rod 61 must have a value equal to one-half of the difference of such length and such width. Accordingly, where apparatus 10 is used to handle various arrays of components which differ from array to array in the length and width of the components included therein, different settings of the initial position of plate 60 and of its rearward stroke must be used for such different arrays in order to render the respective components thereof in standardized position for robot pick-up.

It will be evident that, in the FIG. 3 case, the robot jaws are adapted to grip component 100e bilaterally symmetrically as easily when the component is in its position B as when it is in its position C. Similarly, in the FIG. 4 case, those jaws are adapted to grip component 100f bilaterally symmetrically as easily when the component is in its position F as when it is in its position G. It will be recognized therefore that a primary purpose in pressing the component against fixed wall 54 in both the FIG. 3 and FIG. 4 cases is to sense (via the signal or lack of it produced by microswitch 74) whether the component is then positioned on the conveyer in lengthwise position or widthwise position since it is only for the latter position that a rearward stroke of stop plate 60 is required in order to ready the component for proper pick-up. The pressing of the component against wall 54 in both the FIG. 3 and FIG. 4 cases also serves the secondary purpose, however, of assuring that the component is fully "squared up" in relation to line 95 as it might not be if only the combined effects on the component of stop plate 60 and the conveyer movement were relied on to produce such "squaring up".

When, it both the FIG. 3 and the FIG. 4 case, the component is picked up by the robot jaws, the two dimensional axes of the component need not, before pick up, be exactly parallel to and normal to, respectively, the centerline 95 of jaws 89,90 in order for the component to be bilaterally symmerical with that line when gripped by these jaws. That is so because in the course of such gripping, the jaws can straighten out a slight degree of initial angular twisting of the component relative to line 95 so that, when fully gripped, the component becomes bilaterally symmetrically positioned about line 95. The core feature of the component positioning actions described in connection with FIG. 3 and FIG. 4 is, therefore that, in both cases, they result in a positioning of the center of the component to register with the common centerline 95 for the robot jaws. However, it is better than not that, also, the length or width axis, as the case may be, of the component be concurrently accurately aligned with that centerline.

In the movement of the components one at a time into zone 50, a component entering and being positioned (as described) in that zone may be followed on so closely by another component that the lagging component may catch up and bear against the leeding component to interfere with its pick up by the robot unit. To prevent such interference from occurring, the signal produced by detector 63 in response to passage through beam 66 of the leading component is utilized by controller unit 40 to actuate air cylinder 80 (FIG. 1) to drive rod 82 towards guide wall 59 until the lagging compnent is clamped by that rod against such wall. The ensuring restraint of movement of the lagging component prevents it from bearing against the leading component so that the latter can be picked up by the jaws of robot unit 85 without interference. When the leading component is raised by the robot to a predetermined level higher than the tops of the components on conveyor 45, the reaching of that level generates in the robot unit a "clear signal" fed via lead 97 to controller unit 40. Unit 40 in turn responds to that "clear" signal to actuate air cylinder 80 to retract rod 82 to thereby end the restraint on the lagging component which then becomes the new leading component.

The above-described embodiment being exemplary only, it is to be understood that additions thereto, omissions therefrom and modifications thereof can be made without departing from the spirit of the invention. Accordingly, the invention is not to be considered as limited save as is consonant with the scope of the following claims.

What is claimed is:

1. Apparatus for handling bulk array of articles comprising: an upwardly facing hopper tray for receiving said array, said tray having at it front a discharge opening the bottom of which is defined by an edge of said tray, an elongated horizontal conveyer disposed outward of, and tangential on its inner side with, said edge and extending alongside said opening and beyond it to a zone spaced from said opening, motor means for moving said conveyer forward past said opening into said zone, an abutment opposite said edge at the outer side of said conveyer for retaining articles thereon, tray tilting means for displacing said tray's rear up and down relative to its front so as to move said tray between down and up angular positions at which articles on said tray will, respectively, remain on it and slide off it onto said conveyer for transport thereby of said articles to said zone, the tilting of said tray down being adatped to relieve pressure on articles forced on such conveyer against said abutment by articles still on said tray, article sensing means disposed along said conveyer between said opening and the end away from said opening of said zone and adapted to produce signals in response to passage by said sensing means of articles carried by said conveyer from said opening to said zone, jamming of articles on said conveyer resulting in said articles not passing by said sensing means, and a control unit coupled to receive said signals and operable after nonproduction of said signals for a period of time to reversely energize said motor means so as to impart a temporary reverse movement of said conveyer tending to relieve said jamming.

2. Apparatus according to claim 1 in which said sensing means comprises:

a radiation source on one side of said conveyer, and a radiation detector disposed on the other side of said conveyer opposite said source to receive from it a beam of radiation, said detector being responsive to interruption of said beam by articles carried by said conveyer to produce said signals.

3. Apparatus for handling a bulk array of articles all of the same rectangular parallelepiped shape and having a greater length dimension than width dimension, said apparatus comprising: an upwardly facing hopper tray for receiving said array, said tray having at its front a discharge opening the bottom of which is defined by an edge of said tray, an elongated horizontal conveyer disposed outward of, and tangential on its inner side with, said edge and extending alongside said opening and beyond it to a zone spaced from said opening, motor means for moving said conveyer forward past said opening and into said zone, an abutment opposite said edge at the outer side of said conveyer for retaining articles thereon, tray tilting means for displacing said tray's rear up and down relative to its front so as to move said tray between down and up angular positions at which articles on said tray will, respectively, remain on it and slide off it onto said conveyer for transport thereby of said articles to said zone, the tilting of said tray down being adapted to relieve pressure on articles forced on such conveyer against said abutment by articles still on said tray, means for restricting the transport of said articles by said conveyer to said zone to one at a time of said articles, stop means disposed proximately above the carrying surface of said conveyer at the the end of said zone away from said opening, said stop means providing a stop wall extending crosswise of said conveyer and adapted to stop articles brought to said zone by said conveyer, and said stop wall being further adapted to thereafter utilize the forward force imparted by the moving conveyer to such stopped articles to produce rotary movement on said conveyer of such stopped articles at an angle to such wall to an angularly oriented position at which one of the width and length axes of the articles is parallel to such stop wall, said articles stopped and angularly oriented by said stop means being in standard and ninety degree angular position when the width axis and the length axis of the stopped articles are, respectively, parallel to such stop wall, said stop means being translationally moveable back and forth in the direction of conveyer movement, means operable when a stopped angularly oriented article is in ninety degree angular position to produce an indication, and means responsive to such indication to translationally move said stop means and the article stopped thereby an amount equal to the difference between half the length and half the width of said articles so as to align the length axis of a ninety degree positioned stopped article with the line occupied by the width axis of a stopped article in standard angular position.

* * * * *